United States Patent [19]

Marancik et al.

[11] 3,958,327
[45] May 25, 1976

[54] STABILIZED HIGH-FIELD SUPERCONDUCTOR

[75] Inventors: William G. Marancik; Frederick T. Ormand, both of Basking Ridge; Eric Gregory, Chester, all of N.J.

[73] Assignee: Airco, Inc., Montvale, N.J.

[22] Filed: May 1, 1974

[21] Appl. No.: 465,970

[52] U.S. Cl. .......................... 29/599; 174/126 CP; 174/126 S; 148/11.5 R; 148/127
[51] Int. Cl.² .................................. H01V 11/14
[58] Field of Search .................. 29/599; 174/126 CP, 174/DIG. 6; 148/11.5 R, 127

[56] References Cited
UNITED STATES PATENTS

| | | | |
|---|---|---|---|
| 3,370,347 | 2/1968 | Garwin et al. | 29/599 |
| 3,421,207 | 1/1969 | Berghout et al. | 29/599 |
| 3,652,967 | 3/1972 | Tanaka et al. | 174/126 CP |
| 3,665,595 | 5/1972 | Tanaka et al. | 29/599 |
| 3,728,165 | 4/1973 | Howlett | 148/11.5 R |
| 3,836,404 | 9/1974 | Strauss | 148/11.5 R |

Primary Examiner—C. W. Lanham
Assistant Examiner—V. K. Rising
Attorney, Agent, or Firm—Edmund W. Bopp; Larry R. Cassett; H. Hume Mathews

[57] ABSTRACT

A superconducting compound of the A-15 crystal structure type is obtained in a composite by a high temperature diffusion between a first metallic component and a second metallic component contained in a bronze alloy. Stability is achieved by including in the composite a quantity of high-conductivity normal material. Diffusion of the second metallic component into the normal material with a resultant degradation of conductivity of the normal material is prevented by placing an impervious barrier layer between the bronze alloy and the normal material. In a specific embodiment, the barrier layer takes the form of an annular shell comprising at least two sectors of dissimilar metals, one of which reacts with a component of the bronze alloy to form a layer of said superconducting compound, and the other of which is substantially non-reactive. Thus, a discontinuous superconducting ring is formed on the barrier layer which prevents flux trapping.

3 Claims, 10 Drawing Figures

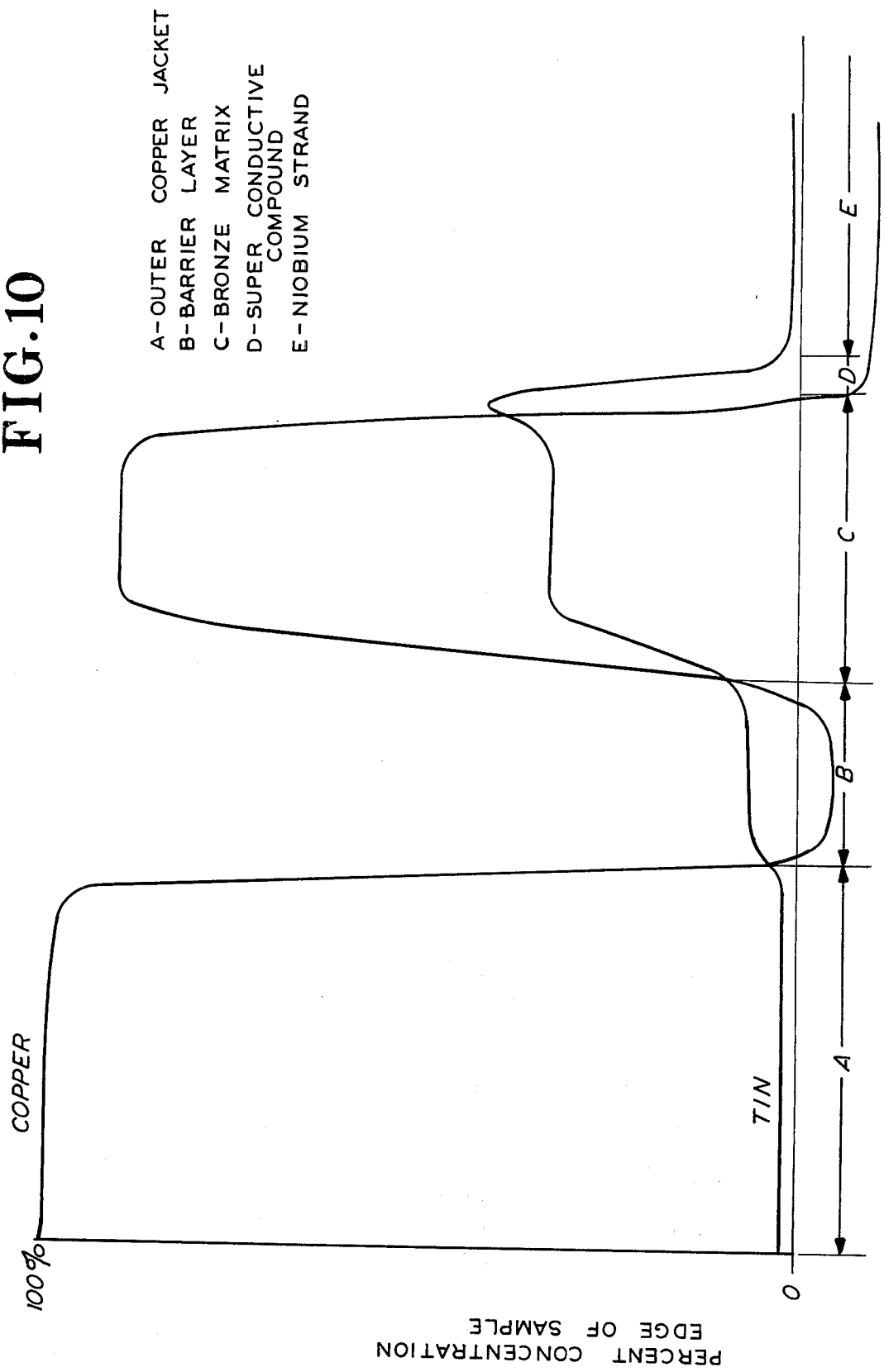

STABILIZED HIGH-FIELD SUPERCONDUCTOR

BACKGROUND OF INVENTION

1. Field of the Invention

This invention relates to composite superconductors, and more particularly to composites comprising high field superconductors of the A-15 crystal structure type.

2. Description of Prior Art

Superconducting materials are those materials which exhibit zero resistance when the temperature of the material is lowered below some critical temperature level. At this critical temperature the material undergoes a transition from the normal to the superconducting state. The temperature at which this transition takes place is exceedingly important, that is, a high critical temperature is very desirable.

Another important superconducting property is that the material should have a high critical current. That is, the maximum current carried before a measurable voltage first appears in the superconducting material must be high.

Therefore, materials which exhibit a high critical temperature, a high critical field and a high critical current are preferred superconductors. Such materials are intermetallic compounds of the A-15 crystal structure including $Nb_3Sn$; $Nb_3Ga$; $V_3Ga$; $Nb_3Al$ and $Nb_3Ge$. The principal difficulty with these materials that has inhibited their acceptance is their inherent brittleness, that is, they easily fracture when stressed. A superconductor must be capable of being wound into a solenoid without subsequent deterioration in its properties, such as would occur if the superconductive compound would fracture during winding.

Composite superconductors of the A-15 type have been made of niobium-tin in the form of a tape. A thin deposit of $Nb_3Sn$ is placed onto a supporting metallic substrate so that the composite structure can be stressed without damage to the superconductor. This can be accomplished by vapor deposition and by diffusion.

In vapor deposition a mixture of gaseous niobium and tin chlorides are deposited on a hot stainless steel strip. By proportioning of the chlorides the deposit will consist of $Nb_3Sn$.

In the diffusion process an initial layer of tin of a specific predetermined thickness is formed on a niobium strip and the resulting laminate is treated at 1000°C to form $Nb_3Sn$ by reaction between the tin and niobium.

The $Nb_3Sn$ composite is then stabilized by laminating it between layers of OFHC copper thereby producing a laminated conductor having superconductive material surrounded by normal material. The high thermal conductivity and high electrical conductivity of the copper provides a protective current shunt in the event that the superconductor should momentarily transform from the superconducting to the normal state.

Aside from the inherent brittleness of tapes comprising an intermetallic compound, the geometry of the product was such that compact, stabilized coils could not be wound. Furthermore, intrinsically stable conductors are generally twisted about a central axis with a pitch of a few inches. This can easily be accomplished in composite filaments of 0.01 – 0.05 inches in diameter, however it is far more difficult to impart such a pitch to a tape of say 0.5 inches wide by 0.01 inches thick.

Recently multifilament A-15 type superconducting wire has been introduced as an alternate to the A-15 tape hereinbefore described. As set forth in British Pat. Spec. No. 1,280,583 a method is disclosed for making multifilament composite superconductors of the A-15 type.

The disclosed method overcomes one of the principal disadvantages of superconductive tapes consisting of intermetallic compounds, namely brittleness. In this method rods of pure niobium are inserted into a solid copper-tin alloy matrix or into a particle mass of copper and tin powders. The assembly is then mechanically worked to fine wire. The initial rods are now filamentary strands that are converted into a superconductive compound by heating the wire at 773.9°C (1425°F) for about 96 hours. This heat treatment permits niobium and tin to react and form $Nb_3Sn$ on the periphery of the filaments.

Although this method produces satisfactory multifilament $Nb_3Sn$ we have found that the overall superconducting properties to be less than satisfactory. As we have previously indicated a stabilized superconductor must have a quantity of high purity normal material interposed in the conductor to act as a shunt in the event the conductor transforms from the superconducting to the normal states. High purity copper, silver and aluminum can be used. These materials exhibit high electrical and thermal conductivities. It is well known in the art that conductivity of the normal material can be seriously degraded by the slightest amount of contamination.

To stabilize a multifilament superconductor as taught by the aforementioned British Specification, high purity (OFHC) copper rods could be inserted into the copper-tin matrix or a copper sheath could be used as a jacket for the assembly. The conductivity of the copper would not be affected during mechanical working down to fine wire. However, once the high temperature heat treatment starts tin will not only diffuse into the niobium filaments to form $Nb_3Sn$; it will also diffuse into the high purity copper thereby destroying the thermal and electrical conductivity of this material. The final product will not be a stabilized superconductor.

SUMMARY OF INVENTION

In accordance with our invention, as hereinafter more fully described, we form a composite superconductor containing at least a single fine filament with a periphery of an A-15 Type II superconductive compound, high purity normal material for stabilization of the superconductor and an impervious barrier layer. This is accomplished by forming a composite containing a first metallic component of an A-15 Type II superconductive compound, a bronze alloy that contains a second metallic component which is capable of reacting with the first metallic component so as to form a superconductive compound, high purity normal material for stabilizing the composite, and an impervious metallic barrier layer interposed between the normal material and the bronze alloy.

After the composite is assembled it is mechanically worked from a relatively large diameter of about 2 inches to 10 inches to a wire size of about 0.1 to 0.008 inch diameter. Conventional working may be employed such as an initial high temperature extrusion, intermediate wire drawing and finally fine wire drawing. When the desired wire diameter is obtained a carefully controlled heat treatment is performed. The wire is heated to a temperature to cause the first metallic component and the second metallic component contained in the bronze alloy to diffuse and react with each other to form the desired superconductive compound on the periphery of one of the components.

The thermal and electrical conductivity of the normal material is not impaired by diffusion of the first or second metallic component into it. The purity of the normal material is maintained by the placement of an impervious barrier layer between it and the bronze alloy. This layer insures that diffusion into the normal material is prevented.

A stabilized high-field superconductor with an A-15 type compound can be obtained by this invention. The superconductive compound is produced after the final wire diameter is obtained by a high temperature heat treatment. Contamination of the high purity normal material is prevented by incorporating an impervious barrier layer into the superconductor. This layer must be placed in such a position so as to prevent diffusion of a metallic component into the normal material.

In a particular embodiment of the present invention, the barrier layer takes the form of an annular shell comprising sectors of at least two different metallic materials. One of these sectors is adapted to react with a component of the bronze alloy under the final high temperature heat treatment to form a superconducting layer. The other sector is substantially non-reactive with the surrounding materials. Thus, a discontinuous ring of superconductor is formed which substantially prevents flux trapping tending to impair the performance of the superconducting composite.

Accordingly, it is an object of this invention to provide an improved method of making stabilized high-field superconductors.

It is a further object of this invention to provide a method of making a stabilized high-field multifilament superconductor of an A-15 type.

Still a further object of this invention is to provide a method of making a stabilized high-field superconductor of an A-15 type containing high purity normal material by heat treating a composite wire without contaminating the normal material.

Another object of this invention is to provide a stabilized multifilament high-field superconductor of the A-15 type.

Still a further object of this invention is to provide a composite superconductor that contains a barrier layer for preventing contamination of high purity normal material employed for stabilization.

A more specific object of the invention is to form an annular barrier layer which reacts to form a discontinuous superconducting ring which prevents flux trapping in the composite.

FIB. 5 is a cross-sectional view of a composite showing another embodiment of this invention.

Figure 5:
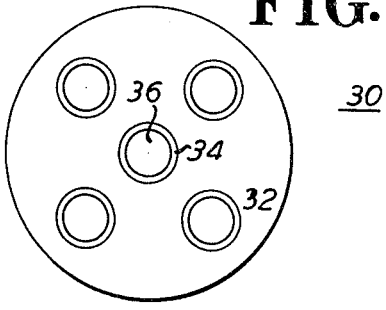
Figure 6:
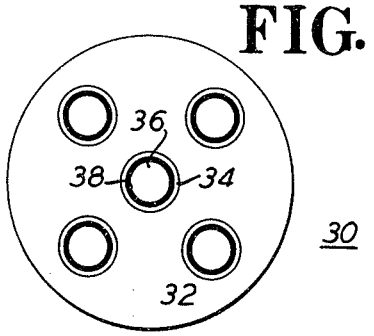

FIG. 6 is a cross-sectional view of the composite of FIG. 5 after the same has been heat treated to form a superconductive compound.

Figure 7:
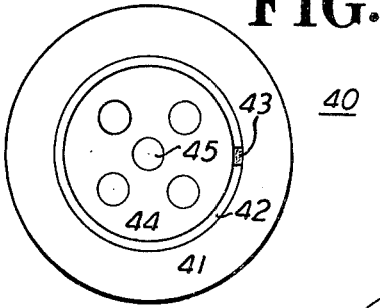

FIG. 7 is a cross-sectional view of a composite showing another embodiment of this invention, comprising a barrier layer in the form of an annular shell formed from sectors of at least two different metallic materials.

Figure 8:
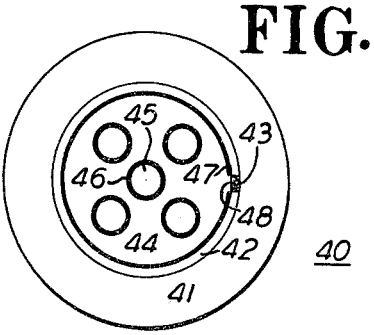

FIG. 8 is cross-sectional view of the composite of FIG. 7 after the same has been heat treated to form a discontinuous annular ring of superconducting material.

Figure 9:
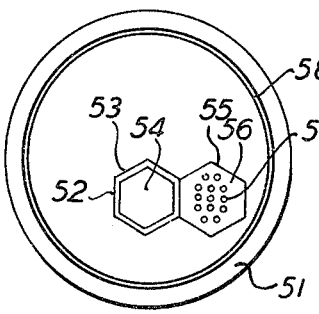

FIG. 9 is a cross-sectional view of a composite showing another embodiment of this invention.

FIG. 10 is a plot showing a micro-probe line scan performed on superconducting wire of this invention.

DESCRIPTION

FIGS. 1, 3, 5 and 7 show in cross-section various configurations that illustrate superconducting composites of this invention. FIGS. 2, 4, 6 and 8 show the configurations of FIGS. 1, 3, 5 and 7 after a high temperature heat treatment has formed a superconductive compound of the A-15 crystal structure. These figures will now be discussed in more detail.

Figure 1:
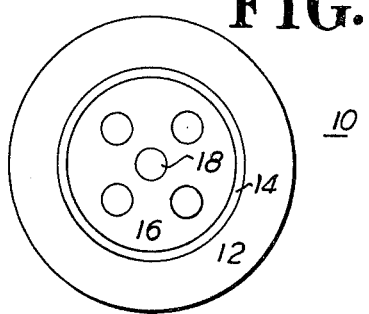
FIG. 1 is a cross-sectional view of a composite of this invention.

FIG. 1 shows a composite 10 with an annular outer shell 12 of a normal material. OFHC (oxygen free high conductivity copper), aluminum, gold, or silver may be employed. For obvious economic considerations, OFHC copper or aluminum are usually employed. A barrier layer 14 is placed adjacent to the normal material.

The selection of barrier layer materials is critical. The barrier layer must form a continuous impervious obstruction; it must be pure so as not to contaminate the high purity normal material; and it also must be ductile in order to permit co-reduction with the other materials of the composite. Suitable barrier layer materials for this configuration include tantalum, molybdenum and alloys thereof.

A bronze alloy matrix 16 is placed within the barrier layer. This matrix is typically copper alloyed with a predetermined amount of tin or gallium. The specific alloying element employed is determined by the desired superconductive compound. For instance, if the compound is to be $Nb_3Sn$, tin will be alloyed with copper. In a like manner, if $V_3Ga$ is the desired superconductive compound, gallium will be alloyed with copper.

The matrix is provided with a plurality of longitudinally extending parallel bores. Metallic rods 18 are inserted into these bores thereby completing the composite. These rods are of a material which is capable of combining with the alloying element of the matrix so as to form the desired superconductive compound. If $Nb_3Sn$ is the desired compound niobium rods 18 would be inserted into a bronze matrix containing tin as the alloying element. Likewise if $V_3Ga$ is the desired compound vanadium rods 18 would be inserted into a bronze matrix containing gallium as the alloying element.

Figure 2:
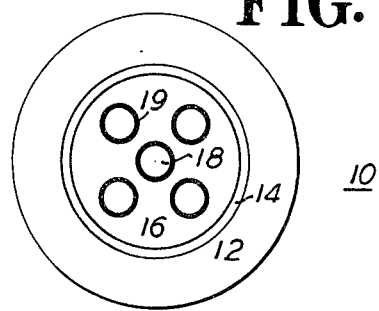
FIG. 2 is a cross-sectional view of the composite of FIG. 1 after the same has been heat treated to form a superconductive compound.

FIG. 2 shows a superconductive compound 19 formed on the periphery of metallic rods 18. This compound can be either $Nb_3Sn$ or $V_3Ga$ depending upon the selection of the matrix alloying element and the metallic rod insert.

After composite 10 has been assembled it is mechanically worked by techniques well known in the art, such as extrusion and drawing to a fine wire size. The working is performed at a temperature below that which appreciable diffusion between the component contained within the bronze and the metallic rod takes place. After the composite has been reduced to the desired cross-section it is heated to a temperature at which an appreciable amount of diffusion will take place within a reasonable period of time. The mechanical properties of the filaments are thought to be related to the ratio of the amount of superconductive compound formed and the filament diameter. By determining the filament size the amount of superconductive compound formed can be controlled. Concentration of tin and gallium in the matrix and the temperature at which the diffusion reaction takes place will also determine the ratio of superconductive compound to the filament diameter.

Diffusion of the tin or gallium within the matrix takes place in all directions. These elements would diffuse in an outward direction toward the normal material 12 without the presence of a barrier layer; and if diffusion into the normal material is permitted, thermal and electrical conductivity would be destroyed. This would result in an unstable superconductor; and the potential benefits of using A-15 superconductive compounds would be negated.

Contamination of the normal material by diffusion of gallium or tin is prevented by the impervious barrier layer 14. This layer effectively obstructs the passage of tin and gallium atoms into the normal material. By positioning the barrier layer between the bronze matrix and the normal material, diffusion of the alloying element contained within the matrix is allowed to proceed only toward the metallic component within the matrix. An additional benefit of this invention is that a lesser amount of the alloying element is needed to alloy with copper since this element is not diluted by diffusion into the normal material. A matrix with a lesser amount of tin or gallium will be more ductile thereby permitting greater reductions-in-area before annealing must be performed to restore ductility.

A variation of the embodiment of FIGS. 1 and 2 can be achieved by mechanically working composite 10 to an intermediate size, for instance approximately 0.375 inches. The wire at this size is formed into a hexagonal cross-section and cut into short lengths, generally equal in length to an extrusion cannister. These short, hexagonal lengths are packed into a copper extrusion cannister. The cannister is then mechanically worked into small diameter wire. This variation produces a wire with a honeycomb network of normal material such as OFHC copper throughout the entire superconductor cross-section. Such a construction provides very good thermal and electrical conductivity from the interior to the exterior of the superconductor.

Figure 3:
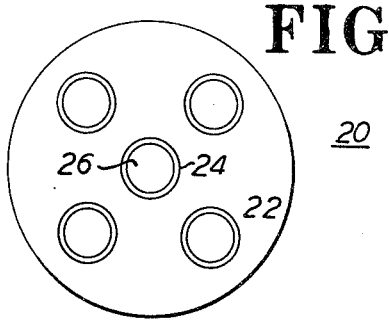
FIG. 3 is a cross-sectional view of a composite of another embodiment of this invention.
Figure 4:
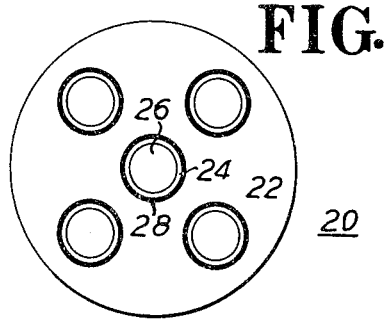
FIG. 4 is a cross-sectional view of the composite of FIG. 3 after the same has been heat treated to form a superconductive compound.

Referring now to FIGS. 3 and 4, there is shown another composite illustrating this invention.

FIG. 3 shows a composite 20 consisting of a bronze alloy matrix 22. As previously described the matrix can be copper alloyed with tin or gallium depending upon the superconductive compound desired. The matrix is provided with a plurality of longitudinally extending parallel bores. Disposed within said bores are hollow metallic sleeves 24. These elements perform two functions; firstly, they are one of the metallic components of the resultant superconductive compound, and secondly, they also act as barrier layers in the manner as hereinbefore described. Positioned within these sleeves are rods 26 of normal material.

Sleeve 24 can be formed from pure niobium or vanadium. Rods 26 can be formed from any high purity normal material as hereinbefore described.

FIG. 4 shows a superconductive compound 28 formed on the periphery of sleeves 24. This compound can be either $Nb_3Sn$ or $V_3Ga$ depending upon the composition of matrix 22 and sleeve 24. Penetration into the normal material is prevented by the sleeves.

Referring now to FIGS. 5 and 6, there is shown another composite illustrating this invention.

FIG. 5 shows a composite 30 consisting of a matrix 32 of normal material. The matrix is provided with a plurality of longitudinally extending parallel bores. Disposed within said bores are hollow metallic sleeves 34. These elements perform as hereinbefore described. Positioned within these sleeves are rods 36 of a bronze alloy.

Sleeves 34 can be formed from pure niobium or vanadium. Rods 36 are of a bronze alloy that furnishes the necessary second metallic component that will combine with a portion of the metallic sleeve thereby producing a superconductive compound.

FIG. 6 shows a superconductive compound 38 formed at the interface between sleeve 34 and rod 36. As hereinbefore described this compound can be either $Nb_3Sn$ or $V_3Ga$. Penetration into the normal matrix by tin or gallium is effectively prevented by sleeve 34 acting in its dual role as a barrier layer.

PREFERRED EMBODIMENT

Referring now to FIGS. 7 and 8, there is shown another composite illustrating a preferred embodiment of this invention.

The composite shown in these figures is essentially the same composite illustrated in FIGS. 1 and 2. A composite 40 consists of annular outer shell 41 of normal material and immediately adjacent thereto is barrier layer 42. In this embodiment the barrier layer can be vanadium or niobium and a small segment 43 of another metallic element such as molybdenum or tantalum. A bronze matrix 44 is placed within the barrier layer. The matrix is provided with a plurality of longitudinally extending parallel bores. Metallic rods 45 are inserted into these bores thereby completing the composite.

FIG. 8 shows a superconductive compound 46 formed on the periphery of metallic rods 45. Since barrier layer 42 is either niobium or vanadium a superconductive compound 47 is also formed on this element. There is an area 48 adjacent the small segment 43 that does not contain any superconductive compound. Therefore, the compound formed on the barrier layer is not a continuous ring and cannot act as a flux trap. Flux trapping impairs the performance of a superconductor and must be avoided.

FIG. 9 shows another composite 50 illustrating this invention. In this embodiment, there is provided a hollow extrusion cannister 51. A series of hexagonal components are then fitted together in a geometrical array on the interior of the cannister.

Hexagonal component 52 consists of a barrier layer 53 and an internal portion 54 of normal material. Hexagonal component 55 consists of a bronze matrix 56 and metallic filaments 57. After composite 50 has been assembled and worked down to a fine wire size a superconductive compound is formed in the manner as hereinbefore described.

If the extrusion cannister is made from a high purity normal material and contamination is to be avoided a barrier layer 58 may be employed.

It should be understood that the selection and proportioning of components is very important. High purity normal materials such as OFHC copper, aluminum, gold and silver may be used. The proportion of gallium and tin in the bronze alloy is significant. Sufficient gallium and tin must be present to form the desired A-15 crystal structure, however, if these elements are present in too large an amount objectionable precipitants may form.

The heat treating cycle must be controlled in order to form a superconductive compound of sufficient thickness to impart satisfactory superconducting properties to the composite but yet maintain a certain amount of ductility in the composite.

SPECIFIC EXAMPLE

A 2 inch bronze extrusion billet approximately 5-¾ inches long containing 10 weight percent tin was prepared with a machined blunt nose and a recessed rear portion for receiving a bronze cap. 19 holes, 19/64 inches in diameter, 4 inches in length were drilled in the billet.

a. 19 pure niobium rods were inserted into the billet. The billet was evacuated and the bronze cap was electron beam welded onto the billet.
b. The billet was preheated to 676.67°C (1250°F) and extruded to 0.55 inches.
c. The extruded billet was drawn to 0.375 inch wire.
d. The drawn wire was wrapped with a high purity annealed tantalum sheet, approximately 0.010 inch thick. The wrapped wire was inserted into an OFHC tube with an inside diameter slightly greater than 0.375 inch.
e. The OFHC tube was drawn to 0.4 inch and then placed inside a one inch diameter copper extrusion billet, heated to 676.67°C (1250°F) and extruded to 0.4 inch.
f. The extruded billet was drawn to 64 mils. After each 20% reduction in area the wire was annealed.
g. The drawn wire was then heat treated at 700°C (1292°F) for 3 days thereby obtaining a layer of $Nb_3Sn$ around each niobium filament.

FIG. 10 shows a micro-probe line scan performed on material of this example. This figure shows that area A, the outer copper jacket after the high temperature heat treatment remains essentially pure copper. This means that section B, the tantalum barrier layer, effectively prevented diffusion of tin from the bronze matrix, section C, into the outer copper jacket. It can be assumed that neither copper nor tin is present in section B. To confirm this assumption a point count was conducted in area B by putting the probe's electron beam onto a series of points in this area. There was no signal at any point which would indicate the presence of tin. The fluctuation above and below the line representing zero concentration in section B is a normal background effect for this type of analysis and does not reflect a change in composition. Section C represents the matrix material, section D represents the superconductive compound, and section E represents the core of the niobium filament.

The critical current $Ic$ measured at various magnetic fields for this 64 mil wire at 4.2°K is as follows: 40 kilogauss, $Ic = 76$ amperes; 50 kilogauss, $Ic = 60$ amperes, 60 kilogauss, $Ic = 46$ amperes; 70 kilogauss, $Ic = 36$ amperes.

To illustrate the effect of pure copper on the stability of superconducting composites the following experiment was performed. The resistance of a $Nb_3Sn$ multifilament composite, 19 strands of niobium in a bronze matrix was compared to the resistance of the wire of this example at 20°K and room temperature.

The data tabulated in Table I shows that copper in the wire of this invention significantly lowers resistance when measured at 20°K and room temperature. Furthermore, the resistivity ratio of the wire of this invention is more than 23 times greater than the unstabilized superconductor. The use of uncontaminated copper in the wire of this invention will provide a protective current shunt in the event that the superconductor should momentarily transform from the superconducting to the normal state. There is no such assurance with the superconductor utilizing the unstabilized bronze matrix.

| Composite Description | Wire Dia. (mils) | Resistance Data, at 20°K | | Resistance Data at Room Temperature | | Ratio $\bar{e}$ R.T. / $\bar{e}$ 20°K |
|---|---|---|---|---|---|---|
| | | R mΩ | $\bar{e}$ μΩcm | R mΩ | $\bar{e}$ μΩcm | |
| 19 filaments of Niobium in Bronze | 12.5 | 6 | 2.4 | 34.5 | 13.7 | 5.75:1 |
| Wire of Invention | 64 | .0013 | 0.0135 | 0.175 | 1.82 | 135:1 |

It may, therefor, be seen that the invention provides a stabiliized high-field superconductor and a method of making same.

Various modifications of the invention in addition to those shown and described herein will become apparent to those skilled in the art from the foregoing description and accompanying drawings. Such modifications are intended to fall within the scope of the appendant claims.

We claim:

1. A stabilized high-field superconductor composite, comprising:
   a bronze alloy matrix containing a plurality of parallel bores, wherein said alloy furnishes a metallic component of an A-15, Type II superconductive compound;
   a plurality of metallic rods inserted into said bores, said rods being capable of reacting with said matrix during heat treatment at a predetermined reaction temperature to form said superconductive compound;
   a sheath of normal material for stabilizing said composite surrounding said matrix; and
   a barrier layer substantially impervious to diffusion by said alloy metallic component at temperatures up to and including said reaction temperature interposed between said normal material and said matrix, said barrier layer comprising at least two sectors wherein one said sector is essentially of metal selected from the group consisting of niobium and vanadium, and a second said sector is essentially of a dissimilar metal that does not substantially react with said matrix.

2. The combination in accordance with claim 1 wherein said dissimilar metal consists of molybdenum.

3. The combination in accordance with claim 1 wherein said dissimilar metal consists of tantalum.

* * * * *